United States Patent
Park et al.

(10) Patent No.: US 7,140,092 B2
(45) Date of Patent: Nov. 28, 2006

(54) METHODS FOR MANUFACTURING INDUCTOR CORES

(75) Inventors: Jin-Woo Park, Atlanta, GA (US); Paul Floretn Cros, Atlanta, GA (US); Mark Allen, Atlanta, GA (US); Yong Kyu Yoon, Atlanta, GA (US)

(73) Assignee: Georgia Tech Research Corporation, Atlanta, GA (US)

( * ) Notice: Subject to any disclaimer, the term of this patent is extended or adjusted under 35 U.S.C. 154(b) by 33 days.

(21) Appl. No.: 10/751,360

(22) Filed: Jan. 5, 2004

(65) Prior Publication Data

US 2004/0164839 A1 Aug. 26, 2004

Related U.S. Application Data

(60) Provisional application No. 60/440,652, filed on Jan. 16, 2003.

(51) Int. Cl.
*H01F 7/06* (2006.01)
*G11B 5/147* (2006.01)

(52) U.S. Cl. .................. 29/602.1; 29/604; 29/603.13; 29/603.15; 29/603.18; 427/131; 427/132; 427/404; 216/22

(58) Field of Classification Search ............. 29/602.1, 29/604, 603.13, 603.1, 603.15, 603.18, 846, 29/847; 427/128, 132, 404, 419.1, 419.2, 427/129, 131; 216/22, 40, 54
See application file for complete search history.

(56) References Cited

U.S. PATENT DOCUMENTS

| 3,350,180 | A | * | 10/1967 | Croll ...................... 427/132 X |
| 5,283,942 | A | * | 2/1994 | Chen et al. .......... 29/603.15 X |
| 5,399,372 | A | * | 3/1995 | Grimes et al. ............. 427/131 |

FOREIGN PATENT DOCUMENTS

| JP | 5-258236 | * | 10/1993 | |
| JP | 64-47880 | * | 8/1997 | .......... 427/419.2 X |
| JP | 9-235493 | * | 9/1997 | |

OTHER PUBLICATIONS

Tomita et al., "Sputter-Deposited FeCoBC/AlNx Multilayered Film for Wet-Etching Process", IEEE Transactions on Magnetics, vol. 35, No. 5, Sep. 1999, pp. 3571-3573.*

Jin-Woo Park and Mark G. Allen, Paper entitled "Ultra-Low-Profile Micromachined Power Inductors with Highly Laminated Ni/Fe Cores: Application to Low MHz DC-DC Converters", IEEE Transactions on Magnetics, vol. 39, No. 5, Sep. 2003, pp. 3184-1816, 3 pages.

Charles R. Sullivan and Seth R. Sanders, Paper entitled "Microfabrication of Transformers and Inductors for High Frequency Power Conversion", 1993 IEEE, pp. 33-41, 9 pages.

Charles R. Sullivan and Seth R. Sanders, Paper entitled "Microfabrication Process for High-Frequency Power-Conversion Transformers", 1995 IEEE, pp. 658-664, 7 pages.

(Continued)

*Primary Examiner*—A. Dexter Tugbang
(74) *Attorney, Agent, or Firm*—Thomas, Kayden, Horstemeyer & Risley LLP

(57) ABSTRACT

A representative method for manufacturing a highly-laminated magnetic inductor core includes: depositing at least a first layer of a ferromagnetic material; depositing at least a first layer of a sacrificial conductive material; depositing a support structure formed of a ferromagnetic material; and removing the sacrificial conductive material, thereby leaving the at least first layer of ferromagnetic material mechanically supported by the support structure.

10 Claims, 3 Drawing Sheets

OTHER PUBLICATIONS

Ming Xu, Trifon M. Liakopoulos and Chong H. Ahn, Paper entitled "A Microfabricated Transformer for High-Frequency Power or Singal Conversion", IEEE Transactions on Magnetics, vol. 34, No. 4, Jul. 1998, pp. 1369-1371, 3 pages.

Jae Yeong Park, Suk H. Han, and Mark G. Allen, Paper entitled "Batch-Fabricated Microinductors with Elctroplated Magnetically Anisotropic and Laminated Alloy Cores", IEEE Transactions on Magnetics, vol. 35, No. 5, Sep. 1999, pp. 4291-4300, 10 pages.

Jin-Woo Park, Jae Yeong Park, Yeun-Ho Joung and Mark G. Allen, Paper entitled "Fabrication of High Current and Low Profile Micromachined Inductor With Laminated Ni/Fe Core", IEEE Transactions on Components and Packaging Technologies, vol. 25, No. 1, Mar. 2002, pp. 106-111, 6 pages.

Jin-Woo Park, Florent Cros and Mark G. Allen, Paper entitled "A Sacrificial Layer Approach to Highly Laminated Magnetic Cores", 4 pages.

Steven D. Leith and Daniel T. Schwartz, Paper entitled "*In-situ* Fabrication of Sacrificial Layers in Electrodeposited NiFe Microstructures", J. Micromech. Microeng. 9 (1999). Printed in the United Kingdom, pp. 97-104, 8 pages.

Chun-Chen Yang and Huk Y. Cheh, Paper entitled "Pulsed Electrodeposition of Copper/Nickel Multilayers on a Rotating Disk Electrode", *J. Electrochem. Soc.*, vol. 142, No. 9, Sep. 1995, pp. 3034-3043, 10 pages.

\* cited by examiner

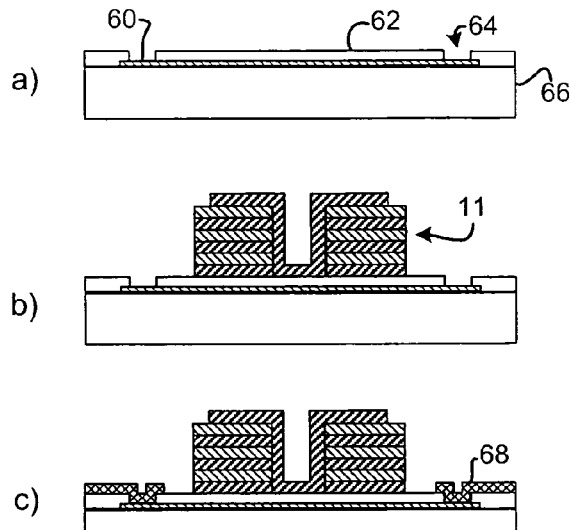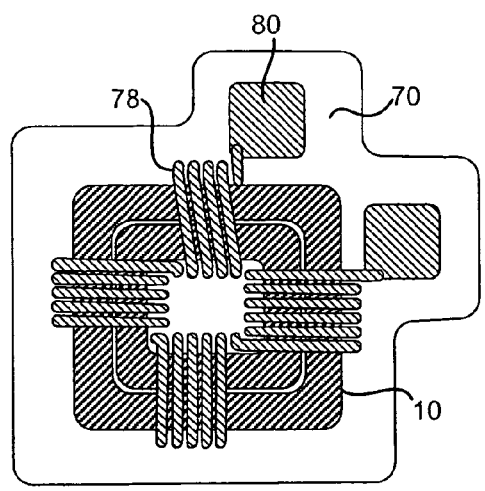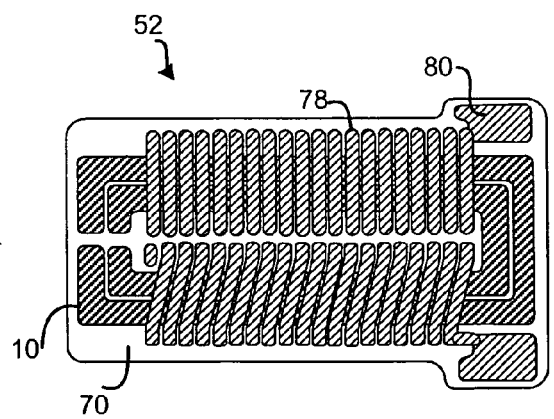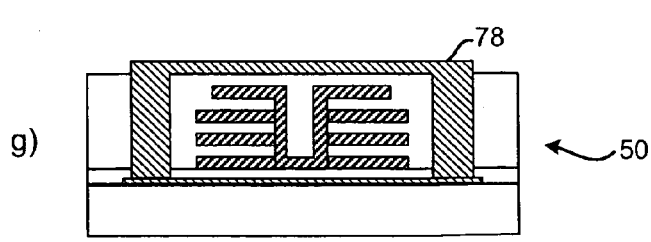
FIG. 3A
FIG. 3B
FIG. 3C

METHODS FOR MANUFACTURING INDUCTOR CORES

CROSS-REFERENCE TO RELATED APPLICATION

The present application claims the benefit of co-pending U.S. provisional patent application, issued Ser. No. 60/440,652, and filed Jan. 16, 2003, which is hereby incorporated by reference in its entirety.

GOVERNMENT INTEREST

The U.S. Government has a paid-up license in this invention and the right in limited circumstances to require the patent owner to license others on reasonable terms as provided for by the terms of contract #5710000193 awarded by the Defense Advance Research Projects Agency and contract #DABT63-98-1-0009 awarded by the Army Research Office MURI Program.

FIELD OF THE INVENTION

The present invention generally relates to the fabrication of microelectronic components. In particular, the present invention relates to microfabricated integrated inductors and the magnetic cores included therewith.

DESCRIPTION OF THE RELATED ART

As electronic devices, in particular, computing devices continue to decrease in size, engineers are working to decrease the size of the devices' power units, or power converters. A power transformer is at the heart of the power converter; in order to reduce the size of the complete power converter, the dimensions of the power transformer should be reduced. An integrated inductor formed of two conductive coils wrapped around a ferromagnetic core generally takes up a large portion of a power transformer.

It is possible to reduce the size of the inductor by switching to a higher operating frequency. However, a higher operating frequency causes higher flux oscillation frequency inside the inductors's soft magnetic material. Unless the ferromagnetic core is suitably designed, more important losses due to eddy current effects will accompany higher flux oscillation frequency in the soft magnetic material.

The problem may be addressed by using a ferromagnetic material with very high electrical resistivity, such as ferrites and iron powder magnetic cores. However, these materials are limited in terms of maximum flux densities that they can carry. The maximum flux density is usually referred to as $B_{sat}$. The lower the $B_{sat}$, the larger the cross section of the magnetic core of the inductor, therefore preventing further reduction of the overall dimensions of the magnetic core. High $B_{sat}$ electrodepositable material with high electrical resistivity do not exist. The most common high $B_{sat}$ material are alloys of nickel (Ni), iron (Fe), and cobalt (Co) alloyed with various other metals such as vanadium or molybdenum. They are unfortunately excellent electrical conductors as well. In order to reduce the eddy current losses inside a magnetic core made of such high $B_{sat}$ material, laminated cores are created.

A suitably laminated magnetic core is such that it is formed with multiple electrically isolated layers of the given high $B_{sat}$ ferromagnetic material. These layers are suitably physically oriented in order to allow quantities, such as magnetic fluxes, to flow in the desired direction. Keep in mind that the relevant thickness of each individual layer is a function of multiple physical and technical parameters, such as the conductivity, the magnetic permeability of the ferromagnetic material, and the range of frequency at which the complete device is supposed to work.

Up to now, it has been hard to fabricate structures with multiple laminations whose individual thickness is, because of the increase of the frequency of operation, in the range of a few micrometers. In macro-scale magnetic devices, low-loss laminated cores are typically achieved by stacking alternating layers of core material and insulating material (which block eddy current flow), and laminating the entire stack together. Laminations have also been utilized in micromachined magnetic components. Previous approaches to micromachined laminations include one-step electroplating of vertical high-aspect-ratio structures, repeated deposition of insulator, seed layer, and permalloy (NiFe) films; multiple sputtering of thin magnetic and dielectric layers; and mechanical lamination of polymer-coated NiFe foils.

Although these approaches have demonstrated improvement in device performance, processability and scaling remain as unaddressed issues. As permeability and desired operation frequencies increase, lamination thickness should be reduced to the micron range (i.e., on the order of the magnetic skin depth), while simultaneously maintaining total core thickness of tens to hundreds of microns to prevent saturation.

These requirements dictate large numbers of thin, high-aspect-ratio laminations, which are difficult to achieve using the previously proposed approaches. For example, in the case of vertically-laminated structures, the required aspect ratio of the mold laminations increases, making mold fabrication difficult. Horizontal lamination using repeated deposition of magnetic thin films and insulators, e.g., by sequential sputtering, overcomes this difficulty but may not be able to achieve the required overall stack thickness due to stress issues. Electroplating of horizontal laminations offers the possibility of fabricating structures of sufficient overall thickness, but the repeated switching of substrates between plating bath and vacuum systems becomes unmanageable as the number of layers increase. Finally, conventional foil lamination becomes difficult as the foil thickness approaches the micron range, especially since mechanical strain of magnetic foils has been demonstrated to degrade magnetic properties.

Due to the shortcomings of the prior art, it would be desirable to have a manufacturable approach allowing micron-scale (or smaller) laminations and large total core thickness.

SUMMARY OF THE INVENTION

A microfabricated magnetic inductor core and an integrated inductor are disclosed, as well as the novel methods for manufacturing such devices. The magnetic inductor core of the present invention have reduced eddy current losses. For this reason, the integrated inductor of the present invention exhibit significantly improved performance over solid-core devices. The methods for fabricating these devices are less time-consuming and simpler then other approaches, and lend themselves toward batch processing.

A first embodiment of the present invention may be construed as a method for manufacturing a highly-laminated magnetic inductor core. The method includes depositing at least a first layer of a ferromagnetic material; depositing at least a first layer of a sacrificial conductive material; depositing a support structure formed of a ferromagnetic material; and removing the sacrificial conductive material, thereby leaving the at least first layer of ferromagnetic material mechanically supported by the support structure.

A second embodiment of the present invention may be construed as a method for manufacturing an integrated inductor. The method is as follows: micro-molding and electroplating a conductive material atop a substrate to form a bottom portion of a conductor coil; depositing and patterning a layer of photosensitive epoxy atop the bottom portion of the conductor coil; and sequentially electrodepositing at least a first layer of a ferromagnetic material and at least a first layer of a sacrificial conductive material atop the photosensitive epoxy; electrodepositing a support structure formed of a ferromagnetic material; selectively etching the sacrificial conductive material, thereby leaving the at least first layer of ferromagnetic material mechanically supported by the support structure which forms a magnetic core for the integrated inductor; depositing a layer of epoxy resist over the magnetic core; and patterning the epoxy resist to form vertical electrical vias for the vertical portions of the conductor coil; depositing a layer of photoresist over the epoxy resist; patterning the photoresist to form horizontal spaces for a top portion of the conductor coil; and electrodepositing a conductive material filling the vertical electrical vias and the horizontal spaces, thus forming the conductor coil integrally wrapped around the magnetic core.

A third embodiment of the present invention may be construed as a magnetic inductor core. The magnetic inductor core includes a first stack of ferromagnetic layers spaced apart a first predetermined distance and a second stack of ferromagnetic layers spaced apart a second predetermined distance. A ferromagnetic support structure is included to mechanically support the first and second stack.

A fourth embodiment of the invention may be construed as an integrated inductor. The integrated inductor includes a magnetic inductor core that includes: a first stack of ferromagnetic layers spaced apart a first predetermined distance, a second stack of ferromagnetic layers spaced apart a second predetermined distance, and a ferromagnetic support structure mechanically supporting the first and second stack. The integrated inductor also includes an integrated conductor coil microfabricated around the magnetic inductor core.

Other embodiments, features, and advantages of the present invention will be or become apparent to one with skill in the art upon examination of the following drawings and detailed description. It is intended that all such additional systems, methods, features, and advantages be included within this description, be within the scope of the present invention.

BRIEF DESCRIPTION OF THE DRAWINGS

Many aspects of the invention can be better understood with reference to the following drawings. The components in the drawings are not necessarily to scale, emphasis instead being placed upon clearly illustrating the principles of the present invention. Moreover, in the drawings, like reference numerals designate corresponding parts throughout the several views.

FIG. 3A is a cross-sectional view of an embodiment of an integrated inductor comprising the magnetic core of FIG. 2B as it is developed through its manufacturing process.

FIG. 3B is a top view of one embodiment of an integrated inductor as developed by the manufacturing process illustrated in FIG. 3A.

FIG. 3C is a top view of a second embodiment of an integrated inductor as developed by the manufacturing process illustrated in FIG. 3A.

DETAILED DESCRIPTION

Figure 1A:
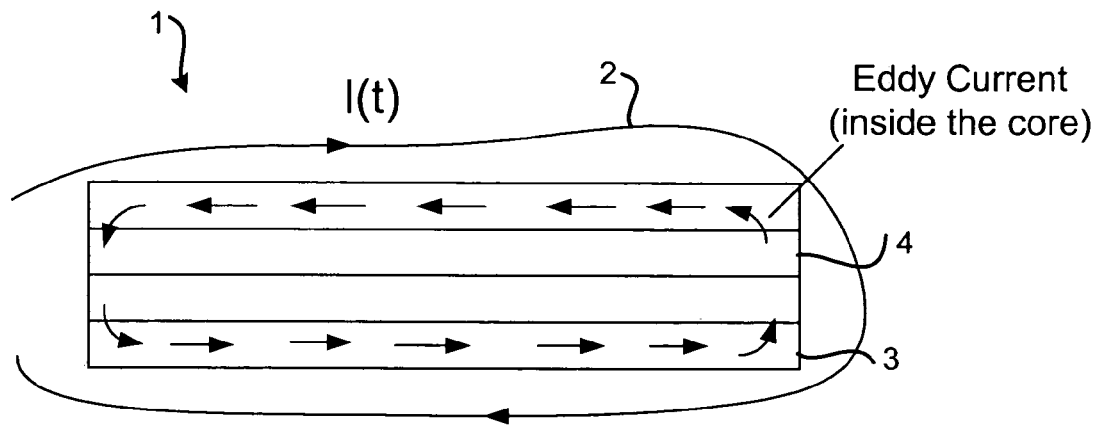
FIG. 1A is a diagram illustrating the effects of a solid conducting core.

As will be described in greater detail herein, a novel laminated magnetic core and integrated inductor comprising the same is disclosed. Referring now in more detail to the drawings, FIG. 1A illustrates the effects caused by operating with a solid conducting core 4. As components become smaller and smaller, the magnetic core 4 becomes smaller and smaller by way of the individual laminations 3 becoming closer and closer together. Eventually, the laminations 3 become so close together that they collectively behave much like a solid conducting core. As current, I(t), 2 is applied through a conductive coil (not shown) wrapped around the core 4, an eddy current is generated and flows through a closed loop formed of the stacked, electrically conductive laminations 3. This results in a lossy conducting core 4.

Figure 1B:
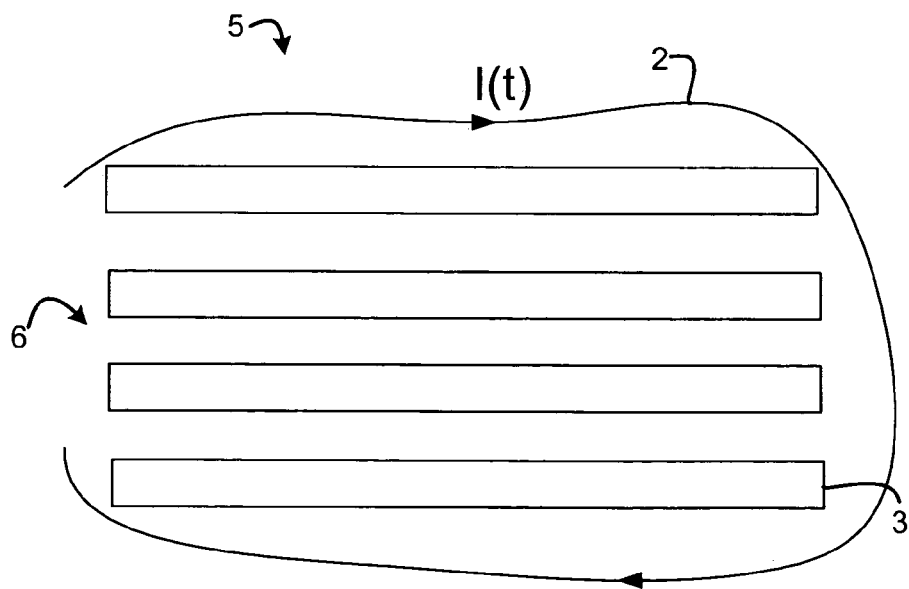
FIG. 1B is a diagram illustrating the effects of a conducting core with spaced conductive layers.

FIG. 1B is a diagram illustrating the effects of a conducting core 6 with spaced conductive layers 3. The conducting layers 3, or laminations, may be separated by a dielectric, such as polymer or air. As current 2 flows through a conducting coil wrapped around the coil, no eddy current develops because there is no closed loop for which an eddy current may flow. The dielectric spacing between the conducting layers 3 prevents this from happening. As one can see however, the spacing of the conductive layers 3 adds to the height of the core 6. Furthermore, if air is used as the dielectric, it is quite obvious that this structure alone will not work, as the conducting layers 3 can not float atop each other.

Figures 2A, 2B:
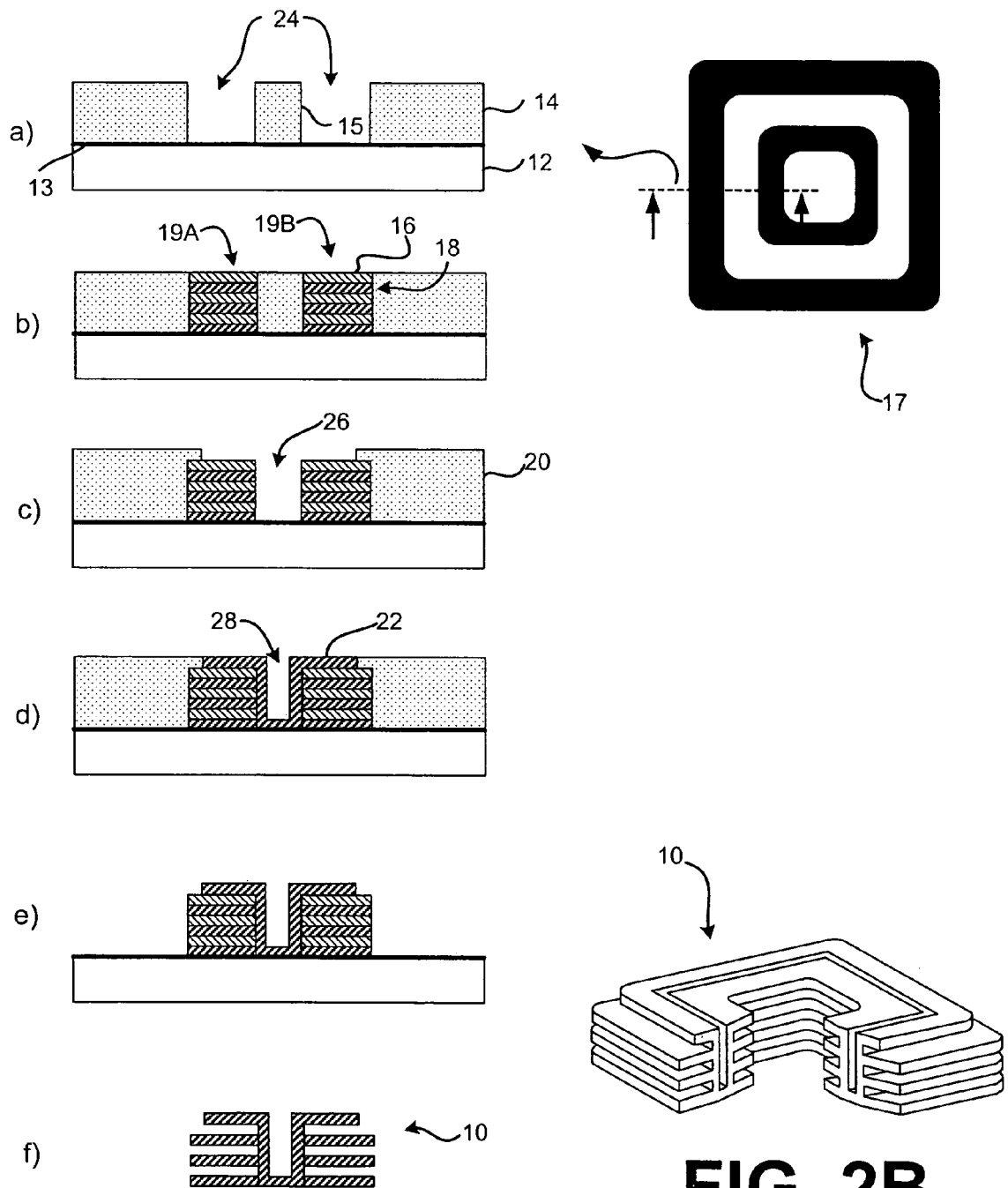
FIG. 2A is a cross-sectional view of an embodiment of a highly-laminated magnetic core as it is developed through its manufacturing process.
FIG. 2B is a perspective view of an embodiment of the highly-laminated magnetic core as developed in FIG. 2A.

Proposed is a novel laminated magnetic core that solves the above-mentioned problems. FIG. 2A is a cross-sectional view of an embodiment of a highly-laminated magnetic core 10 as it is developed through its manufacturing process. FIG. 2B is a perspective view of the embodiment of the highly-laminated magnetic core 10 as developed in FIG. 2A. It should be noted that several variations can be made to the magnetic core 10, and subsequently to the process by which it is fabricated. Moreover, steps may be executed out of order from that shown or discussed, including substantially concurrently or in reverse order, depending on the functionality involved. Features of the manufactured devices may vary as well. For example, the thickness, the overall dimensions, and the total number of laminations can be adapted in order to yield the realization of wide variety of devices. Furthermore, although certain materials are utilized for the magnetic core 10, substitute materials may be utilized without departing from the scope of the invention. For example, permalloy (NiFe) is used for the ferromagnetic layers, but other materials, including other alloys, could be utilized instead. For example, NiFeCo and CoFe which are high $B_{sat}$ materials could be utilized as well as NiFeMo which is a low hysteresis-loss material.

At step a), using standard techniques, a seed layer 13 is deposited on a substrate 12 and a thick photoresist layer 14 is processed in order to create a mold 17. The mold 17 is formed of two low aspect ration trenches 24, in the preferred embodiment, 30 µm deep and 500 µm wide. The mold 17 is a 4 mm×4 mm square ring, and the ring 15 is 1 mm wide. As just stated, the preferred dimensions are just that, preferred. One of skill in the art will appreciate that these dimensions may vary without departing from the scope of the present invention. With these variances, the specific shape of the mold 17, and thus the core 10 can vary. For instance, a rectangular toroid shape may be utilized without departing from the scope of the invention. Alternatively, a circular toroid shape or a bar type solenoid shape may be utilized.

Once the photoresist layer 14 is placed to form the mold 17, the mold is filled with sequential electrodeposition of a ferromagnetic, in this case permalloy (NiFe; about 80%–20%), and sacrificial, in this case copper (Cu), layers 18 and 16, respectively (step b)). In the preferred embodiment, two stacks of three 4 µm thick layers 18 of NiFe are deposited. Each layer 18 of NiFe is separated from the next NiFe layer 18 by a 6 µm layer 16 of Cu. Note that during the formation of the stacks, each layer provides a good electrical base for the electrodeposition of the subsequent layer.

The photoresist layer 14 and 15 is removed to form two adjacent Cu/NiFe multi-layered structures separated by a central trench 26. It should be noted that the two structures will include layers of NiFe and Cu of roughly similar dimensions. In other words, the first stack will eventually have spacings between adjacent NiFe layers that are the same as the spacings of adjacent NiFe layers of the second stack. In alternative embodiments, however, the stacks could have non-similar dimensions.

A new layer 20 of photoresist is patterned leaving the central trench 26 (step c)). A final NiFe layer 22 is then electrodeposited over the two stacks and the central trench 26 (step d)), leaving a central spacing 28. This 4 µm thick layer coats the sidewalls inside the trench 26 as well as the upper surface of each stack.

Once again the photoresist layer 20 is removed leaving the NiFe/Cu stacks joined by the NiFe final layer 22 sitting atop the substrate 12 (step e)). The fabrication of the core 10 ends with the selective etching of the Cu layers 16 between the NiFe layers 18 (step f)). The central NiFe layer 22 is a support structure holding in place each individual NiFe lamination layer 18 once the Cu layers 16 are removed.

The dimensions of the central spacing 28 may vary and are a function of the desired compactness of the magnetic core 10. In general, the spacing 28 should be as narrow as possible to still provide for sufficient electrical isolation. Early experiments have found a spacing 28 of 50 microns to be sufficient.

The dimensions of each NiFe layer 18 may vary as well. Lamination of the core 10 of an inductor is particularly effective when the thickness of an individual lamination layer 18 is on the order of (or smaller than) the skin depth of the given material at a given frequency of operation. The preferred magnetic material used in the core 10 is electroplated NiFe although alternative magnetic materials could be utilized. NiFe's reported relative permeability and conductivity are 800 and $5 \times 10^6 (\Omega.m)^{-1}$, respectively. Using these values, the skin depth of NiFe is approximately 5 microns at a frequency of 2 MHz, thus each lamination layer 18 may be fabricated in this, or less than this, thickness range. The skin depth $$(\delta_c) = \frac{1}{\sqrt{\pi f \mu_c \sigma_c}},$$

where f is the frequency of the alternating magnetic flux, $\mu_c$ is the permeability of material, and $\sigma_c$ is the conductivity of the material. Electroplating of NiFe layers 18 may be performed in a DC magnetic field sufficient to introduce magnetic anistropy in the films and thereby improve high frequency characteristics.

The spacing between NiFe layers 18 may vary but should be around 0.1 microns ~5 microns. The thinner, the better, for the compactness of the magnetic core 10. The number of NiFe layers 18 may vary as well depending on the performance and design characteristics of the magnetic core 10. In order to handle a certain amount of magnetic energy, a certain amount of magnetic core volume is required. Since individual magnetic core thickness is limited (less than one skin-depth thickness at a given operating frequency), the number of NiFe layer should be increased proportionally to the required magnetic core volume.

The preferred approach to fabricating the core 10 is sequential electroplating. Sequential electroplating allows for micron-scale (or smaller) laminations and large total core thickness without the need for interposing vacuum steps or sub-micron lithography. Although avoiding these approaches is an advantage of the present invention, one of skill in the art will appreciate that these approaches could alternatively be utilized. The NiFe layers 18 and Cu layers 16 are sequentially electroplated, followed by a sacrificial etching of the Cu layers 16. Since the copper sacrificial layers 16 are themselves conducting, they acts as a plating base for the subsequent deposition of NiFe without the necessity of multiple vacuum steps, multiple coating of insulating layers, or multiple photolithography steps. Highly laminated structures can therefore be achieved merely by alternating plating baths during fabrication, followed by selective removal of the sacrificial layers to provide electrical insulation between the surfaces of adjacent magnetic layers.

FIG. 2B is a perspective cut-away view of the magnetic core 10 in accordance with embodiments of the present invention. Those skilled in the art will appreciate the sufficient spacing between the NiFe layers, which provides for sufficient electrical isolation between the surfaces of the adjacent magnetic layers due to air space and/or high surface-contact resistance in the case of mechanical contact of adjacent magnetic layers when air spacing is thin. The sacrificial etching has been performed with ammonium hydroxide saturated with cupric sulfate. This etching solution not only etches copper, but also provide high surface-contact resistance between the surfaces of the magnetic layers leaving thin cupric sulfate residue. Preliminary testing has shown this structure to significantly reduce losses as a result of eddy currents.

Having illustrated the process by which a magnetic core 10 may be manufactured in accordance with the present invention, we will now illustrate how to integrate an integrated coil process in with the manufacture of the magnetic core 10.

FIG. 3A is a cross-sectional view of an embodiment of an integrated inductor 50 comprising the magnetic core 10 of FIG. 2B as it is developed through its manufacturing process. The bottom conductor lines 60 of the coil (78 and 60 collectively) are fabricated first using conventional micromolding and electroplating of Cu (step a)). The lines are passivated under a layer of photosensitive epoxy 62, which is patterned in order to create electrical vias 64. A single T—Cu—Ti seed layer (not numbered) is deposited and the fabrication of the laminated core 10 is performed as described in FIG. 2A (step b)).

Before removing the sacrificial Cu layers (16 of FIG. 2A), a thin photoresist 68 is spin-cast and patterned (step c)) in order to clog the electrical vias 64 and protect the underlying Cu lines 60 during the sacrificial Cu etching (step d)). Once the laminated core 10 is fabricated, a thick layer of epoxy resist (SU-8) 70 is then deposited, in order to further structurally reinforce the core 10 as well as to allow the completion of the coil 78. The layer of epoxy 70 is patterned using photolithography to form vertical vias 72 (step e)). The vertical vias 72 allow for the deposition of the vertical sections of the 3D conductor coil. The entire structure is again coated with a conformal layer of Ti—Cu—Ti (not shown) using DC sputtering. A thick layer of conventional photoresist 74 is patterned to create the horizontal openings 75 connecting each vertical via 72 at the upper surface of the epoxy structure 70 (step f)). A final Cu electrodeposition yields the simultaneous fabrication of the vertical as well as the upper horizontal parts of the Cu conductor 78 (step g)). The photoresist 74 and seed layer (not shown) is removed leaving the completed integrated inductor 50.

FIG. 3B is a top view of one embodiment of an integrated inductor 51 as developed by the manufacturing process illustrated in FIG. 3A. Notably, this inductor 51 makes use of the relatively square magnetic core 10. As is illustrated by the process of FIG. 3A, the magnetic core 10 resides in a surrounding epoxy 70. The conducting coil 78 is fabricated as described in FIG. 3A. The contact pads 80 are composed of copper and may be fabricated at the initial step of fabricating the bottom conductor lines for the conductor coil (step a) of FIG. 3A). To provide some scale, the magnetic core 10 is about 3–4 mm wide.

FIG. 3C is a top view of a second embodiment of an integrated inductor 52 as developed by the manufacturing process illustrated in FIG. 3A. This embodiment illustrates a variation to the magnetic core 10. As mentioned in the description of FIG. 2A, the dimensions of the magnetic core 10 may vary given design and performance considerations. Illustrated is a rectangular magnetic core 10, which lends itself to better batch processing. The integrated inductor 52, however, includes similar components as inductor 51 and is manufactured in the substantially same manner as the inductor 50 illustrated in FIG. 3A.

It should be emphasized that the above-described embodiments of the present invention, are merely possible examples of implementations, merely set forth for a clear understanding of the principles of the invention. Many variations and modifications may be made to the above-described embodiment(s) of the invention without departing substantially from the spirit and principles of the invention. All such modifications and variations are intended to be included herein within the scope of the present invention and protected by the following claims.

The invention claimed is:

1. A method for manufacturing a magnetic inductor core, the method comprising:

depositing layers of ferromagnetic material and at least a first layer of sacrificial conductive material such that a first stack of ferromagnetic layers is formed, with the layers of ferromagnetic material of the first stack being spaced apart from each other, and a second stack of ferromagnetic layers is formed, with the layers of ferromagnetic material of the second stack being spaced apart from each other, spacing between the layers of ferromagnetic material of the first stack being established by the sacrificial conductive material located between and separating the layers of ferromagnetic material of the first stack, spacing between the layers of ferromagnetic material of the second stack being established by the sacrificial conductive material located between and separating the layers of ferromagnetic material of the second stack, the first stack being spaced from the second stack;

depositing a support structure such that the support structure is attached to each of the layers of ferromagnetic material of the first stack and to each of the layers of ferromagnetic material of the second stack; and removing the sacrificial conductive material such that the sacrificial material no longer maintains separation between the layers of ferromagnetic material of the first stack, the first stack and the second stack of ferromagnetic layers being mechanically supported by the support structure such that the support structure maintains separation between the layers of ferromagnetic material of the first stack and between the layers of ferromagnetic material of the second stack.

2. The method of claim 1, wherein the depositing steps are performed by electrodeposition.

3. The method of claim 2, wherein the steps of electrodepositing the layers of the ferromagnetic material and the at least first layer of the sacrificial conductive material are performed in an alternating and repetitive manner.

4. The method of claim 1, further comprising:

creating a core mold atop a substrate, wherein the core mold is configured to shape at least the deposited ferromagnetic and sacrificial conductive materials; and removing the core mold once the support structure is electrodeposited.

5. The method of claim 1, wherein the support structure is U-shaped.

6. The method of claim 1, wherein the ferromagnetic material is permalloy.

7. The method of claim 1, wherein the sacrificial conductive material is copper.

8. The method of claim 1, wherein each of the layers of ferromagnetic material has a thickness on an order of or less than a skin depth of the material at a given operating frequency.

9. The method of claim 1, wherein the step of removing is performed by selective etching of the sacrificial conductive material.

10. The method of claim 1, wherein the support structure is formed of a ferromagnetic material.

* * * * *